(12) United States Patent
Milijevic et al.

(10) Patent No.: US 9,444,461 B1
(45) Date of Patent: Sep. 13, 2016

(54) UNIVERSAL INPUT BUFFER

(71) Applicant: Microsemi Semiconductor ULC, Kanata (CA)

(72) Inventors: Slobodan Milijevic, Ottawa (CA); Guohui Situ, Stittsville (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 15/088,188

(22) Filed: Apr. 1, 2016

Related U.S. Application Data

(60) Provisional application No. 62/142,047, filed on Apr. 2, 2015.

(51) Int. Cl.
  *H03K 19/0175* (2006.01)
(52) U.S. Cl.
  CPC ............................ *H03K 19/017509* (2013.01)
(58) Field of Classification Search
  None
  See application file for complete search history.

(56) References Cited

U.S. PATENT DOCUMENTS

| | | |
|---|---|---|
| 5,059,835 A | 10/1991 | Lauffer et al. |
| 5,966,032 A | 10/1999 | Elrabaa et al. |
| 6,472,903 B1 * | 10/2002 | Veenstra ............ H03K 19/1736 326/38 |
| 6,700,403 B1 | 3/2004 | Dillon |
| 7,855,577 B1 | 12/2010 | Teng et al. |
| 8,400,186 B1 | 3/2013 | Wang et al. |
| 2010/0045349 A1 * | 2/2010 | Wang ............... H03K 19/01758 327/108 |
| 2014/0079079 A1 | 3/2014 | Mora Puchalt et al. |

OTHER PUBLICATIONS

International Search Report from corresponding application PCT/CA2016/050383, issued by the Canadian Intellectual Property Office on Jun. 1, 2016.
Written Opinion from the International Searching Authority from corresponding application PCT/CA2016/050383, issued by the Canadian Intellectual Property Office on May 27, 2016.

* cited by examiner

*Primary Examiner* — Anh Tran
(74) *Attorney, Agent, or Firm* — Marks & Clerk; Richard J. Mitchell

(57) ABSTRACT

A universal input buffer has a pair of input pins. A first input of a multiplexer is coupled to the second input pin and a second input of the multiplexer receives a common mode voltage of a differential signal applied to the first pin. The multiplexer is responsive to a selection signal to select either of the first and second inputs of said multiplexer. A pair of single-input buffers have inputs coupled respectively to the first and second input pins. A first input of a first differential buffer is coupled to the first input pin, a first input of a second differential buffer is coupled to the second input pin, the second input of the first differential buffer is coupled to the output of the multiplexer, and the second input of the second differential buffer receives a common mode voltage of a differential signal applied to the second pin.

16 Claims, 7 Drawing Sheets

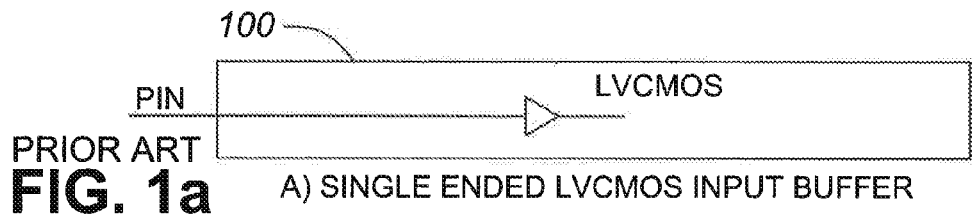
FIG. 1a  A) SINGLE ENDED LVCMOS INPUT BUFFER
PRIOR ART
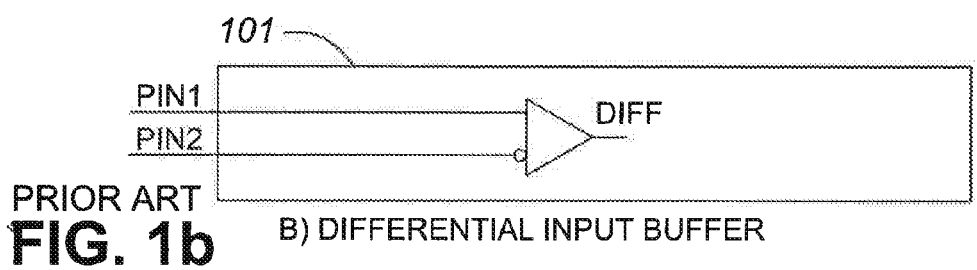
FIG. 1b  B) DIFFERENTIAL INPUT BUFFER
PRIOR ART
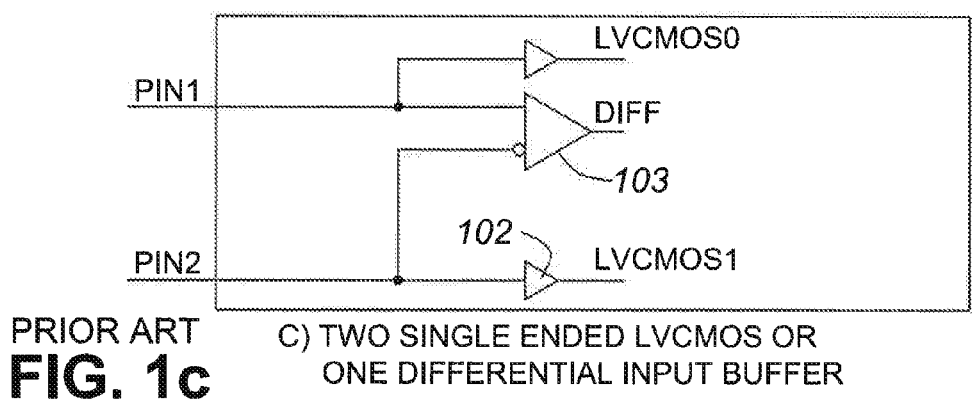
FIG. 1c  C) TWO SINGLE ENDED LVCMOS OR ONE DIFFERENTIAL INPUT BUFFER
PRIOR ART
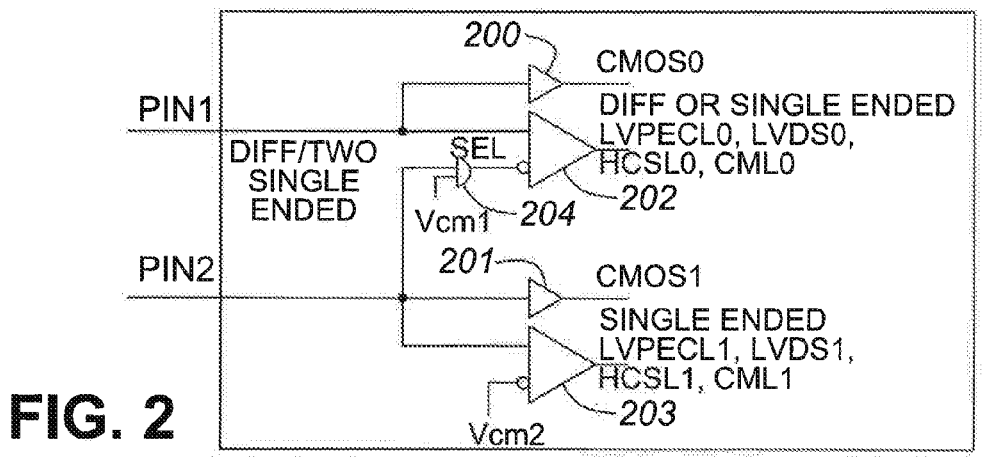
FIG. 2

UNIVERSAL INPUT BUFFER

CROSS REFERENCE TO RELATED APPLICATION

This application claims the benefit under 35 USC 119(e) of U.S. provisional application No. 62/142,047, filed Apr. 2, 2015.

FIELD OF THE INVENTION

This invention relates to the integrated circuits, and more particularly to a universal input buffer.

BACKGROUND OF THE INVENTION

Semiconductor integrated circuits communicate with each other over printed circuit board (PCB) traces using single-ended and differential signaling. Single ended signaling requires only one PCB trace and one pin on transmit and receive devices in case of point to point signaling and differential signaling requires two PCB traces and two pins on each of the transmit and receive devices. Although differential signaling requires twice as many pins and PCB traces as single ended signaling, it is often used in applications where noise immunity is important and for higher frequency signaling (typically over 150 MHz). With respect to voltage levels, input buffers can be designed for rail-to-rail (0 to Vdd) signaling such as Low Voltage Complementary Metal Oxide Semiconductor (LVCMOS) input buffers or sub rail-to-rail signaling as in Low Voltage Positive/Pseudo Emitter-coupled Logic (LVPECL), High-Speed Current Steering Logic (HCSL), Low Voltage Differential Signaling (LVDS) and Current Mode Logic (CML) inputs where input voltage swings around a predefined biasing voltage and the amplitude of the swing is lower than rail-to-rail voltage.

Although the majority of semiconductor devices require input buffers to be either single ended or differential, some devices require input buffers that can receive both single ended and differential signaling, such as Digital Phase Locked Loops (DPLLs), Field-Programmable Gate Arrays (FPGAs) and Complex Programmable Logic Devices (CPLDs). DPLLs typically need to terminate as many as possible input references with wide spread of input frequencies (from 1 Hz to 1 GHz). FPGAs and CPLDs on the other hand are generic devices, which need to handle various input formats and frequencies. Some of these devices have paired input pins so that two input pins can support either two single ended LVCMOS or one differential input.

SUMMARY OF THE INVENTION

Embodiments of the invention provide a universal input buffer that can terminate with two pins, not only two independent LVCMOS or one differential input but also any two independent sub rail-to-rail signals such as LVPECL, HCSL, LVDS and CML.

A major advantage of proposed universal input buffer is reduction of number of pins required for the device. This in turn reduces package size as well as its cost.

According to the present invention there is provided a universal input buffer comprising: first and second input pins; a multiplexer with first and second inputs and an output, the first input of the multiplexer being coupled to the second input pin and the second input of the multiplexer being for receiving a common mode voltage of a differential signal applied to said first pin, said multiplexer being responsive to a selection signal to select either of said first and second inputs of said multiplexer; first and second single-input buffers, having an inputs coupled respectively to said first and second input pins; first and second differential buffers, each of said first and second differential buffers having first and second inputs, the first input of the first differential buffer being coupled to the first input pin, the first input of the second differential buffer being coupled to the second input pin, the second input of the first differential buffer being coupled to the output of the multiplexer, and the second input of the second single-input buffer being for receiving a common mode voltage of a differential signal applied to said second pin.

It will be understood that the generic term pin in this context includes any input connection to the universal input buffer, including terminals, pads and the like.

The single-input buffers accept a single-ended input, such as LVCMOS input signals. The differential buffers, also known as differential receivers, accept a differential input and convert it to a single-ended output, in the preferred embodiment differential input to LVCMOS output, in which case they act as differential-to-LVCMOS converters.

Embodiments of the invention therefore provide a universal two pin buffer capable of terminating two independent LVCMOS inputs or one differential LVPECL, LVDS, HCSL, CML inputs or two independent LVEPCL, LVDS, HSCL, CML inputs.

According to another aspect of the invention there is provided a method of receiving a signal in an integrated circuit in a universal input buffer comprising first and second input pins; a multiplexer with first and second inputs and an output, the first input of the multiplexer being coupled to the first input pin and the second input of the multiplexer being for receiving a common mode voltage of a differential signal applied to said first pin, said multiplexer being responsive to a selection signal to select either of said first and second inputs of said multiplexer; first and second single-input buffers, having an inputs coupled respectively to said first and second input pins; and first and second differential input buffers, each of said first and second differential input buffers having first and second inputs, the first input of the first differential buffer being coupled to the first input pin, the first input of the second differential buffer being coupled to the second input pin, the second input of the first differential buffer being coupled to the output of the multiplexer, and the second input of the second differential buffer being for receiving a common mode voltage of a differential signal applied to said second pin, the method comprising: coupling an input arrangement to said respective first and second input pins, said input arrangement being selected from the group consisting of: a pair of single-ended input lines; a pair of differential input lines terminated in a termination resistor coupled between said differential input lines; and pairs of differential input lines, each pair of differential input lines being terminated in a termination resistance and being coupled respectively to said first and second input pins; and selecting an output of said universal input buffer depending on the input arrangement.

BRIEF DESCRIPTION OF THE DRAWINGS

This invention will now be described in more detail, by way of example only, with reference to the accompanying drawings, in which:—

FIGS. 1a-1c consists of block diagrams of prior art input buffers;

FIG. 2 is block diagram of a universal input buffer in accordance with an embodiment of the invention;

DETAILED DESCRIPTION OF PREFERRED EMBODIMENTS

Block diagrams of prior art input buffers are shown in FIGS. 1a-1c. FIG. 1a shows the simplest LVCMOS input buffer which requires just a single input pin. FIG. 1b shows a differential input pair and FIG. 1c shows a combination input buffer, which can serve either as one differential or two single-ended LVCMOS inputs. The input buffer shown in FIG. 1c is more flexible than buffers shown in FIGS. 1a and 1b, but it cannot terminate two independent sub rail-to-rail inputs.

An embodiment of a universal input buffer in accordance with the invention that can terminate not only two independent LVCMOS inputs or one differential input, but in addition can also terminate two independent sub rail-to-rail inputs, such as LVPECL, HCSL, LVDS or CML, is shown in FIG. 2.

Figure 3:
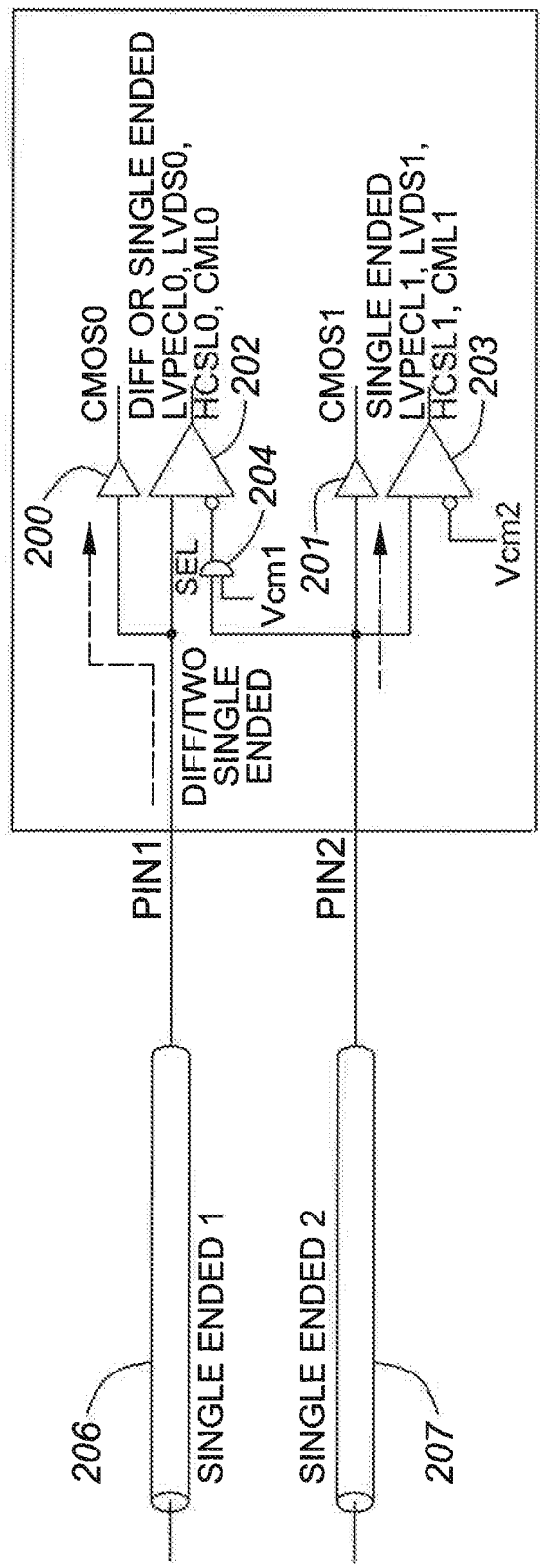
FIG. 3 is a block diagram illustrating the termination of different input signals with a universal input buffer in accordance with the embodiment of FIG. 2.
Figure 4:
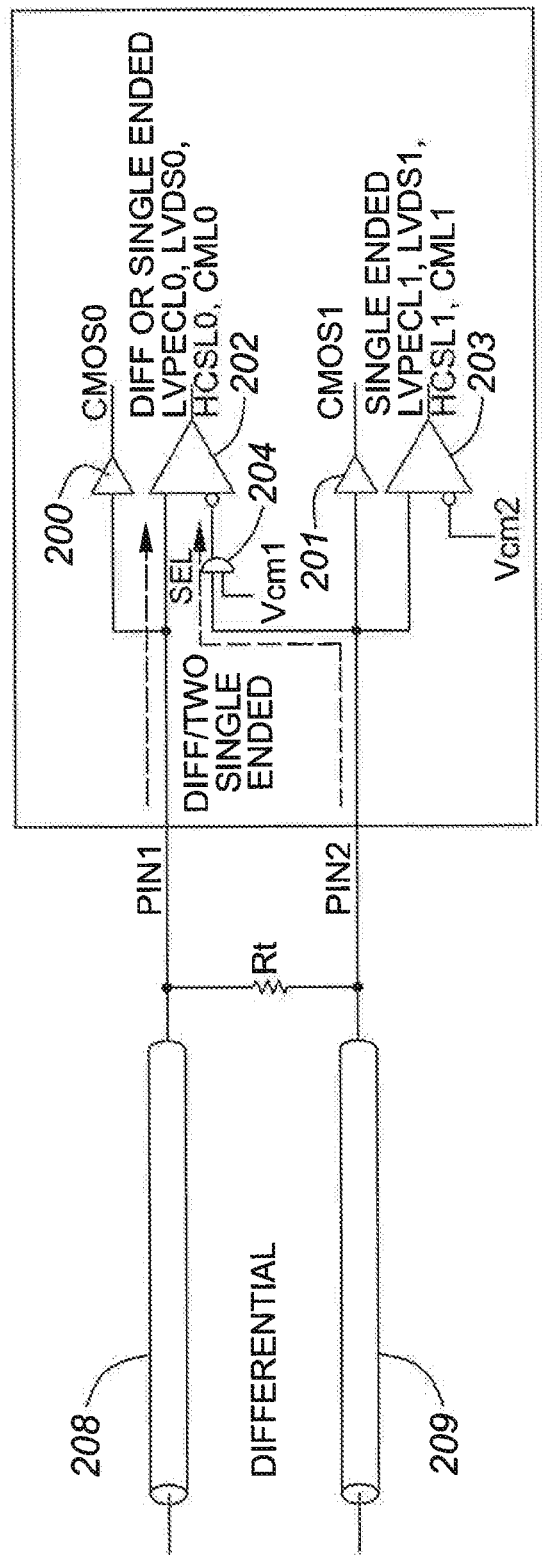
FIG. 4 is a block diagram of an embodiment of a universal input buffer with a differential input.
Figure 5:
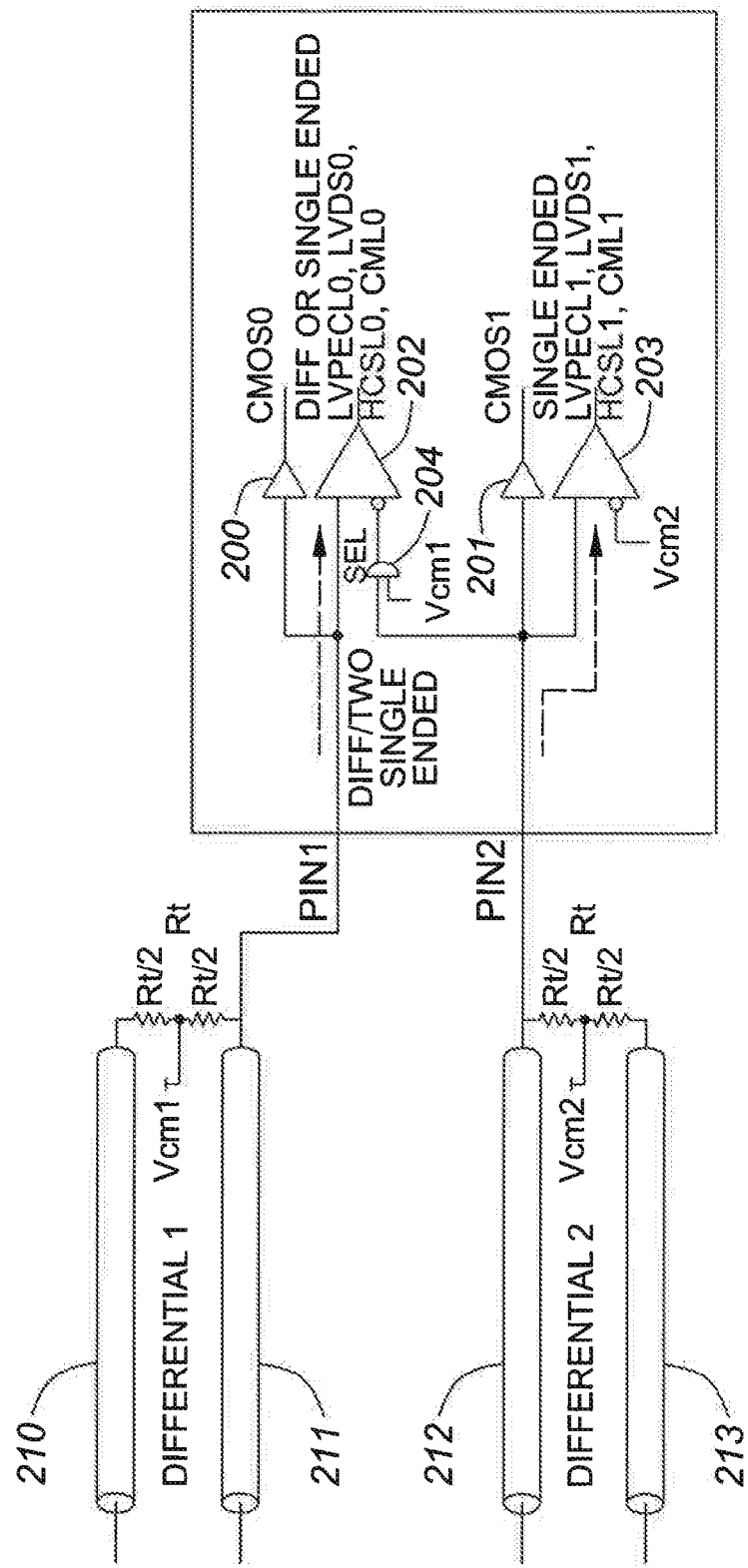
FIG. 5 is a block diagram of an embodiment of a universal input buffer with a pair of differential inputs.

The universal input buffer shown FIG. 2 can operate in three different modes shown respectively in FIGS. 3 to 5. It has two single-input buffers 200, 201, and two differential buffers 202, 203, each with one negative or inverting input and one positive or non-inverting input. The differential buffers 202, 203 serve as differential receivers with LVCMOS outputs.

The universal input buffer also has two independent rail-to-rail inputs (LVCMOS) pin 1, pin 2. The input pin 1 is coupled to the input of single-input buffer 200 and to the first or non-inverting input of differential buffer 202. The input pin 2 is coupled to the input of single-input buffer 201, to the non-inverting input of differential buffer 203 and to a first input of a multiplexer 204. The output of the multiplexer 204 is coupled to the second or inverting input of differential buffer 202.

A common mode voltage Vcm2 is applied to the negative input of differential buffer 203, and a common mode voltage Vcm1 is coupled to a second input of the multiplexer 204, and is therefore selectably, under the control of multiplexer 204, applied to the negative input of differential buffer 202. Either input of the multiplexer 204 can be selected by a user-activated control signal sel depending on the type of input that it is required to accommodate.

The common mode voltages Vcm1 and Vcm 2 can be internally generated using a bandgap voltage reference to match the known common mode voltages of the inputs 206, 207 or can be obtained from the inputs to the universal input buffer.

In a first mode, shown in FIG. 3 by the dashed arrows, each pin, namely pin 1, pin 2, can receive independent single-ended LVCMOS inputs 206, 207. This input is fed to single-input buffers 200 and 201 respectively, which provide the respective outputs.

In a second mode, shown in FIG. 4 by the dashed arrows, the universal input buffer can receive one differential input, which can be LVPECL, HCSL, LVDS, or CML. In this mode the differential input 208, 209 is fed from the pin 1 to the positive input of the differential buffer 202 and from the pin 2, via the multiplexer 204 to the negative input of the differential buffer 202. In this case the output of the differential buffer 202 provides the output. A terminating resistance Rt is coupled between the ends of the pairs of differential inputs 208,209.

In a third mode, shown in FIG. 5, two independent sub rail-to-rail inputs 210, 211 and 212, 213 (LVPECL, LVDS, HCSL or CML) are fed to pin 1 and pin 2 respectively. Respective terminating resistances Rt made up two resistors Rt/2 in series is coupled between the ends of the pairs of differential inputs 210, 211 and 212, 213.

The first input 210, 211 is fed from pin1 to the positive input of the differential buffer 202. The negative input of the differential buffer 202 is coupled to common mode voltage (Vcm1) for the differential inputs 210, 211, via multiplexer 204 responsive to the user-activated control signal sel. The voltage level of Vcm1 applied to the input of the multiplexer 204 may be internally generated and set to match the common voltage of the input signal on inputs 210, 212, or may be tapped directly from the respective terminating resistors Rt/2 as shown.

The second input is fed from pin 2 to the positive input of the differential input buffer 203 and the negative input receives the common mode voltage Vcm2, which corresponds the common mode voltage of the input signal on the inputs 212, 213. The voltage level of Vcm2 applied to the input of the multiplexer 203 may be internally generated and set to match the common voltage of the input signal on inputs 212, 213, or may be tapped directly from the respective terminating resistors as shown.

In this embodiment the two differential input buffers 202, 203 provide the outputs. The embodiments of FIGS. 4 and 5 are suitable for the case where the biasing signal is removed from the transmitting device by coupling capacitors and needs to be recreated.

Figure 7:
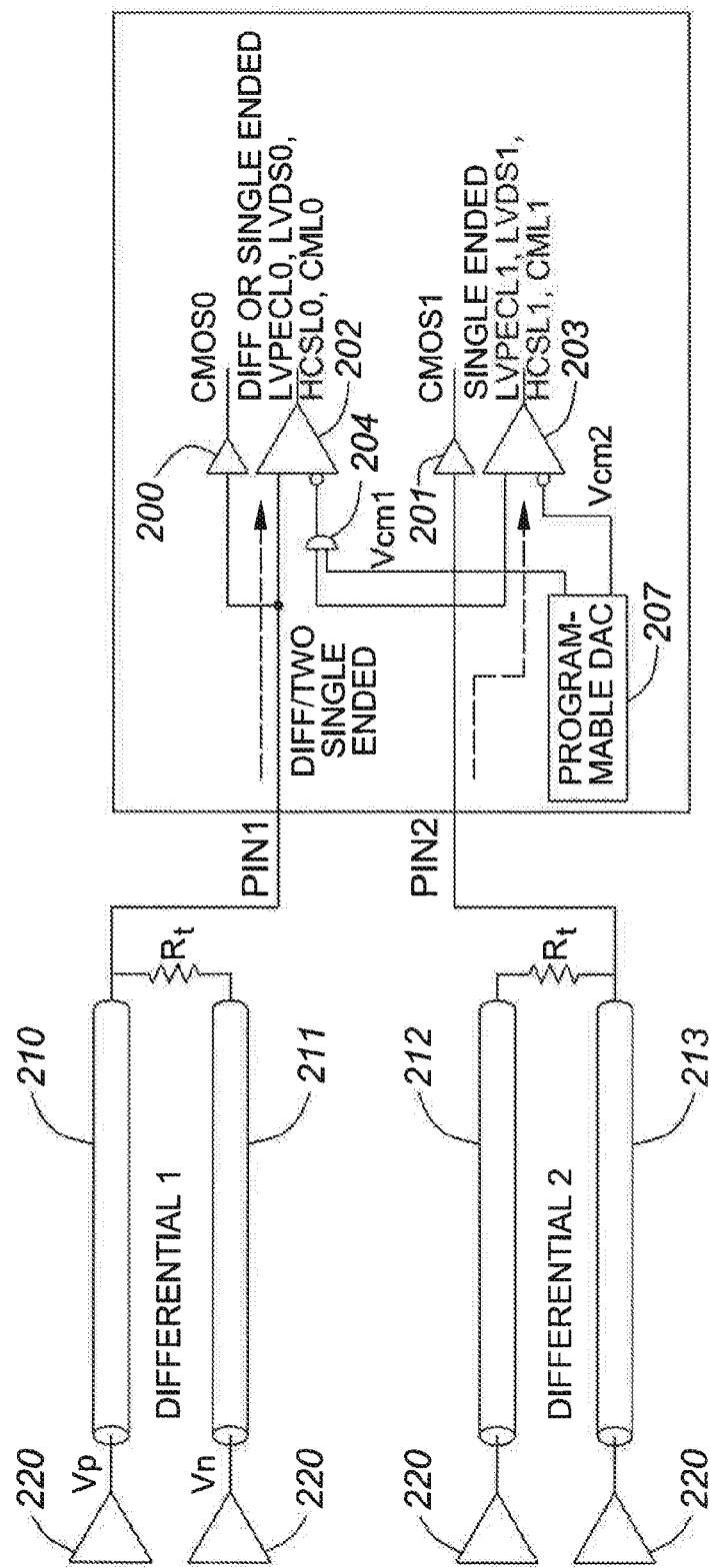
FIG. 7 shows an alternative embodiment similar to the embodiment of FIG. 4, but with a single termination resistor, of an LVDS interface.

In alternative embodiment shown in FIG. 7 Vcm1 and Vcm2 can be generated from a programmable DAC (Digital to Analog converter). Because a DAC can be programmed to output any voltage level between 0 and Vdd, Vcm1 and Vcm2 can be programmed to match common mode voltages of any input signal whether standard or not as long as the common mode voltages are known in advance. In one exemplary embodiment, a fixed voltage, in this case 1.2V, is used to match the requirement for an LDVS interface. For other interfaces, such as LVPECL, HCSL, CML an AC coupled Thevenin termination may be used as shown in FIG. 8.

As previously noted the common mode voltages Vcm1 and Vcm2 may also be generated internally of the universal input buffer from a bandgap voltage reference, which is known in the art as a stable voltage source.

Figure 6:
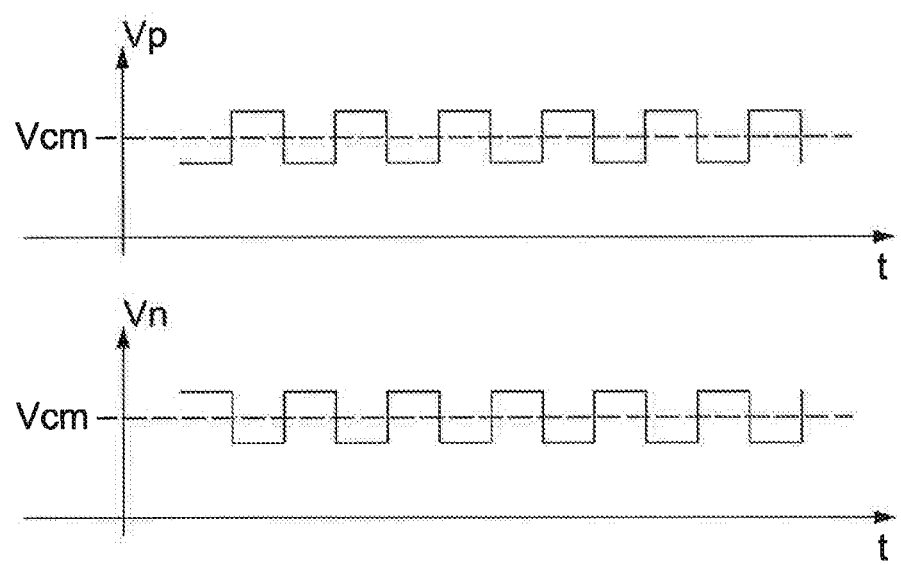
FIG. 6 is a diagram showing the waveforms for an LVDS interface.

FIG. 6 shows the waveforms for an LVDS interface as shown in FIG. 7. The positive (Vp) and negative (Vn) waveforms generated by a differential driver 220 at the transmitter toggle about the average voltage shown by the dotted line, which is the common mode voltage. It should be noted that different transmission standards have different common mode voltages.

Figure 8:
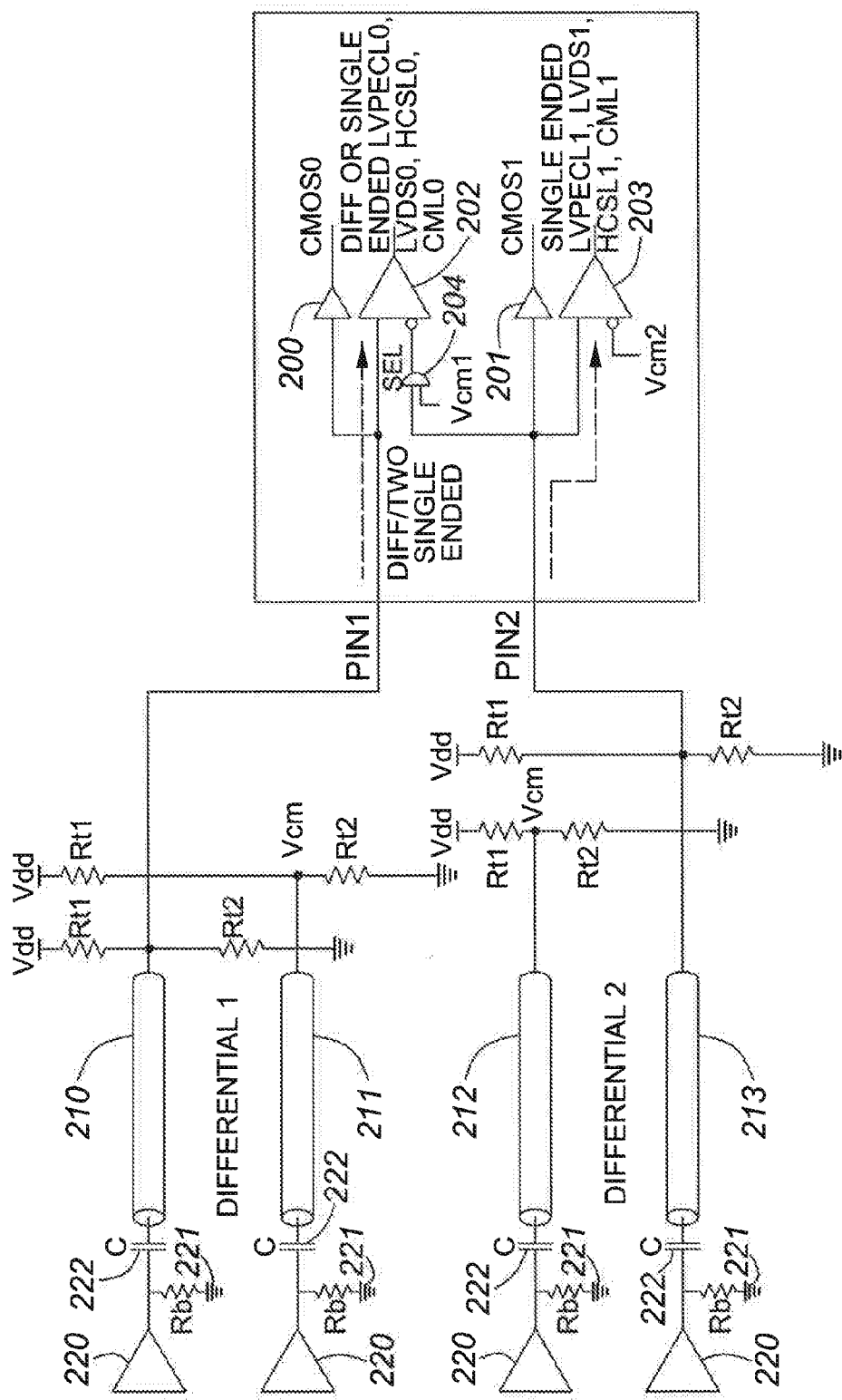
FIG. 8 is an alternative embodiment similar to the embodiment of FIG. 4, but with two termination resistors, of an LVPECL interface.

For the embodiment of FIG. 8, in the case of a Low Voltage Pseudo Emitter Coupled Logic (LVPECL) interface each of the drivers 220 needs a path to ground, which is provided by a respective resistor Rb 221. The common mode voltage of the LVPECL interface is 2V, so the use of an AC coupling capacitor 222, which blocks DC signal from the driver 220, is recommended.

In this embodiment Rt1 and Rt2 are a so-called Thevenin termination, where the termination is provided by Rt1 and Rt2 resistors in parallel. These resistors generate a bias voltage Vcm equal to Vdd*Rt2/(Rt1+Rt2) at their junction points because Rt1 and Rt2 act as a voltage divider. The value of the resistors Rt1 and Rt2 is set so that the bias voltage Vcm matches the internally generated common mode voltages Vcm1 and Vcm2. It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A universal input buffer comprising:
first and second input pins;
a multiplexer with first and second inputs and an output, the first input of the multiplexer being coupled to the second input pin and the second input of the multiplexer being for receiving a common mode voltage of a differential signal applied to said first pin, said multiplexer being responsive to a selection signal to select either of said first and second inputs of said multiplexer;
first and second single-input buffers, having an inputs coupled respectively to said first and second input pins;
first and second differential buffers, each of said first and second differential buffers having first and second inputs, the first input of the first differential buffer being coupled to the first input pin, the first input of the second differential buffer being coupled to the second input pin, the second input of the first differential buffer being coupled to the output of the multiplexer, and the second input of the second differential buffer being for receiving a common mode voltage of a differential signal applied to said second pin.

2. A universal input buffer as claimed in claim 1, wherein said first inputs of said first and second differential buffers are positive inputs and said second inputs of said first and second differential buffers are negative inputs.

3. A universal input buffer as claimed in claim 1, further comprising a pair of single-ended input lines coupled respectively to said first and second pins, said first and second single-input buffers providing respective outputs of the universal input buffer.

4. A universal input buffer as claimed in claim 1, further comprising a pair of differential input lines terminated in a termination resistance coupled between said differential input lines, a first said differential input line being coupled to the first input pin, and a second said differential input line being coupled to the second input pin, said multiplexer being configured to couple said second input pin to said second input of said first differential buffer, an output of said first differential buffer providing an output of the universal input buffer.

5. A universal input buffer as claimed in claim 1, further comprising first and second pairs of differential input lines terminated in respective termination resistances, said first pair of differential input lines being coupled to the first input pin, and said second pair of differential input lines being coupled to the second input pin, said multiplexer being configured to apply to said second input of said first differential buffer a common mode voltage of said first pair of differential input lines and to apply to said second input of said second differential buffer a common mode voltage of said second pair of differential input lines.

6. A universal input buffer as claimed in claim 5, wherein the common mode voltages applied respectively to the second inputs of the first and second buffers are internally generated to match the common mode voltages of the first and second pairs of differential input lines.

7. A universal input buffer as claimed in claim 5, further comprising a programmable digital to analog converter generating said common mode voltages.

8. A universal input buffer as claimed in claim 5, wherein said termination resistances comprises pair of series-connected resistances in a voltage divider configuration to provide said common mode voltages.

9. A universal input buffer as claimed in claim 5, wherein said pairs of differential input lines are terminated in a Thevenin configuration, wherein a first input line of said first differential pair is connected to a junction point of a first pair of series-connected resistances arranged between a supply voltage and ground, and a second input line of each differential pair is connected to a junction point of a said pair of series-connected resistances arranged between a supply voltage and ground.

10. A method of receiving a signal in an integrated circuit in a universal input buffer comprising first and second input pins; a multiplexer with first and second inputs and an output, the first input of the multiplexer being coupled to the first input pin and the second input of the multiplexer being for receiving a common mode voltage of a differential signal applied to said first pin, said multiplexer being responsive to a selection signal to select either of said first and second inputs of said multiplexer; first and second single-input buffers, having an inputs coupled respectively to said first and second input pins; and first and second differential input buffers, each of said first and second differential input buffers having first and second inputs, the first input of the first differential buffer being coupled to the first input pin, the first input of the second differential buffer being coupled to the second input pin, the second input of the first differential buffer being coupled to the output of the multiplexer, and the second input of the second differential buffer being for receiving a common mode voltage of a differential signal applied to said second pin, the method comprising:
coupling an input arrangement to said respective first and second input pins, said input arrangement being selected from the group consisting of: a pair of single-ended input lines; a pair of differential input lines terminated in a termination resistor coupled between said differential input lines; and pairs of differential input lines, each pair of differential input lines being terminated in a termination resistance and being coupled respectively to said first and second input pins; and selecting an output of said universal input buffer depending on the input arrangement.

11. A method as claimed in claim 10, wherein said input arrangement is said pair of single-ended input lines coupled respectively to said first and second pins, and said first and second single-input buffers provide respective outputs of said universal input buffer.

12. A method as claimed in claim 10, wherein said input arrangement is said pair of differential input lines, the method comprising:

selecting the first input of said multiplexer to couple said second input pin to said second input of said first differential buffer; and selecting an output of said first differential buffer as an output of said universal input buffer.

13. A method as claimed in claim 10, wherein said input arrangement is said pairs of differential input lines, the method comprising:

selecting the second input of said multiplexer to couple to apply a common mode voltage of a first said pair of differential input lines to said second input of said first differential buffer, applying a common mode voltage of said second pair of differential input lines to g said second common line to the second input of said second differential buffer; and selecting respective outputs of said first and second differential buffers as outputs of said universal input buffer.

14. A method as claimed in claim 13, wherein the common mode voltages applied to the second inputs of said first and second differential buffers are internally generated to match common mode voltages of said pairs of differential input lines.

15. A method as claimed in claim 13, wherein the common mode voltages applied to the second inputs of said first and second differential buffers are generated by a programmable digital-to-analog converter to match common mode voltages of said pairs of differential input lines.

16. A method as claimed in claim 13, wherein the termination resistances are in the form of voltage dividers directly generating said common mode voltages that are coupled to the second inputs of said first and second differential buffers.

* * * * *